US010352799B2

(12) United States Patent
Li

(10) Patent No.: US 10,352,799 B2
(45) Date of Patent: Jul. 16, 2019

(54) PRESSURE SENSOR, ELECTRONIC DEVICE, AND METHOD FOR MANUFACTURING PRESSURE SENSOR

(71) Applicant: SHENZHEN NEW DEGREE TECHNOLOGY CO., LTD., Shenzhen, Guangdong (CN)

(72) Inventor: Hao Li, Guangdong (CN)

(73) Assignee: SHENZHEN NEW DEGREE TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/075,867

(22) PCT Filed: Feb. 6, 2016

(86) PCT No.: PCT/CN2016/073725
§ 371 (c)(1),
(2) Date: Aug. 6, 2018

(87) PCT Pub. No.: WO2017/133016
PCT Pub. Date: Aug. 10, 2017

(65) Prior Publication Data
US 2019/0049326 A1    Feb. 14, 2019

(51) Int. Cl.
*G01L 9/00* (2006.01)
*G06F 3/045* (2006.01)
(Continued)

(52) U.S. Cl.
CPC ............ *G01L 9/0054* (2013.01); *G06F 3/045* (2013.01); *H01L 29/045* (2013.01); *H01L 29/84* (2013.01)

(58) Field of Classification Search
CPC ...... H01L 29/84; H01L 29/045; G01L 9/0054; G06F 3/045
See application file for complete search history.

(56) References Cited

U.S. PATENT DOCUMENTS 4,400,681 A * 8/1983 Brown .................. G01L 9/0054
338/2
6,649,988 B2  11/2003 Toyoda et al.
(Continued)

FOREIGN PATENT DOCUMENTS

CN    103154867    6/2013
CN    103162873    6/2013
(Continued)

OTHER PUBLICATIONS

International Search Report for PCT/CN2016/073725, dated Oct. 31, 2016, 4 pages.

*Primary Examiner* — Victor A Mandala
(74) *Attorney, Agent, or Firm* — Nixon & Vanderhye PC

(57) ABSTRACT

In the pressure sensor of the present application, at least two resistors are simultaneously formed on the foldable portion and the fixed portion to ensure the uniformity and consistency of the resistance values of all the resistors, and at least one is a strain sensing resistor R1, the foldable portion is folded to the fixed portion, and the resistors are electrically connected to form a pressure measuring circuit. Connecting the pressure sensor to the desired panel can accurately detect the curved deformation of the panel. The resistors in a pressure measuring circuit are adjacently distributed, and the resistance value of the resistor changes with temperature at the same time, so that the influence of the temperature change on the pressure measuring circuit is very small, and the interference against the external environment is good.

15 Claims, 7 Drawing Sheets

(51) Int. Cl.
*H01L 29/04* (2006.01)
*H01L 29/84* (2006.01)

(56) References Cited

U.S. PATENT DOCUMENTS

| | | | |
|---|---|---|---|
| 7,260,996 B2 | 8/2007 | Cheng | |
| 2009/0235753 A1* | 9/2009 | Yamamoto | G01L 9/0054 73/727 |
| 2011/0169745 A1* | 7/2011 | Fang | G06F 3/045 345/173 |
| 2013/0275057 A1* | 10/2013 | Perlin | G06F 3/0414 702/41 |
| 2014/0312440 A1* | 10/2014 | Akiyama | H01L 29/84 257/417 |
| 2016/0320914 A1* | 11/2016 | Tachikawa | G01L 1/205 |
| 2016/0349129 A1* | 12/2016 | Pagani | G01L 9/0052 |
| 2019/0041281 A1* | 2/2019 | Li | G01L 9/06 |

FOREIGN PATENT DOCUMENTS

| | | | | |
|---|---|---|---|---|
| CN | 103837288 | | 6/2014 | |
| CN | 204964077 | | 1/2016 | |
| CN | 204965380 | | 1/2016 | |
| WO | WO 2016/056419 | * | 4/2016 | ............ 29/84 |

* cited by examiner

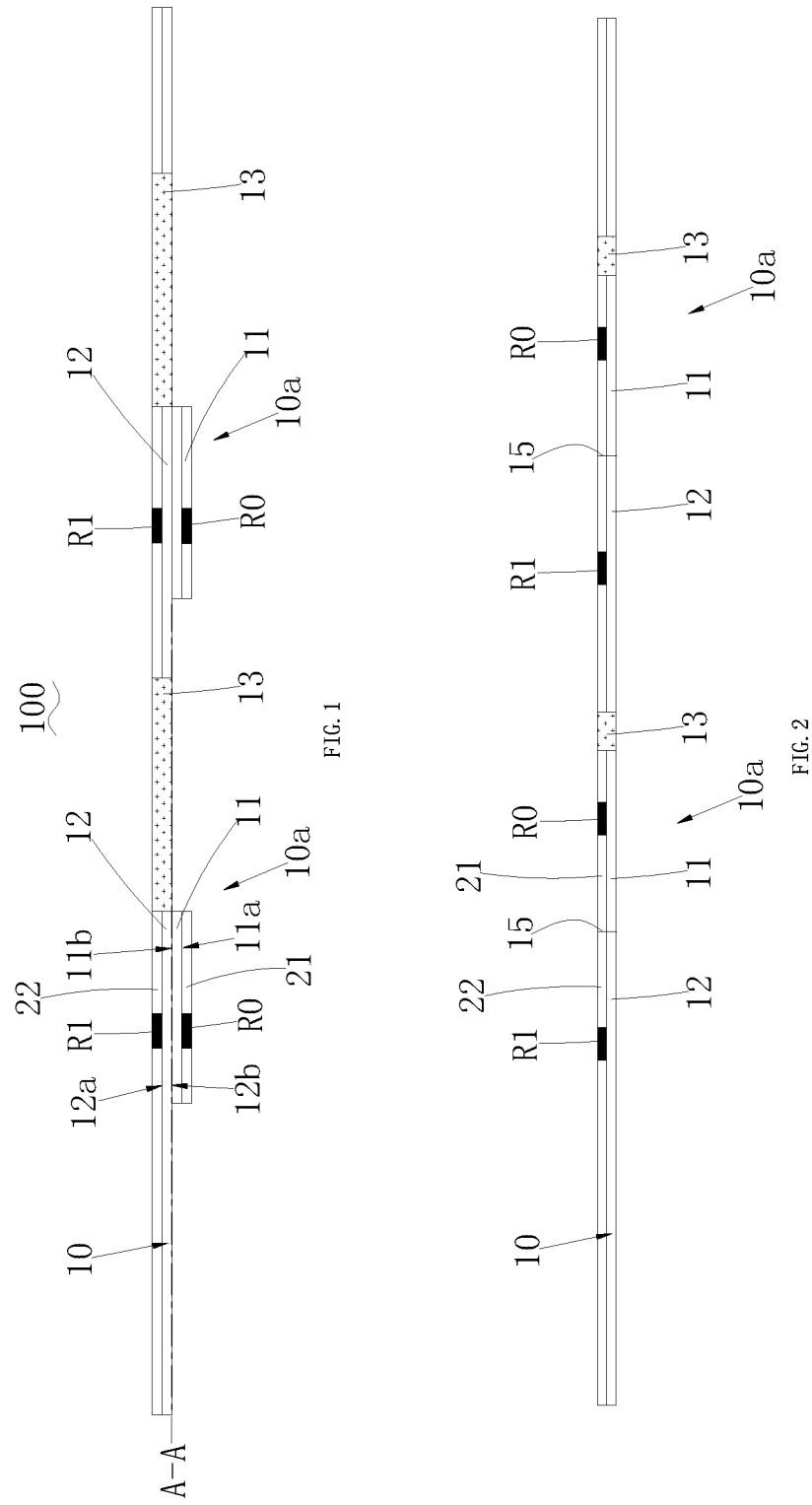

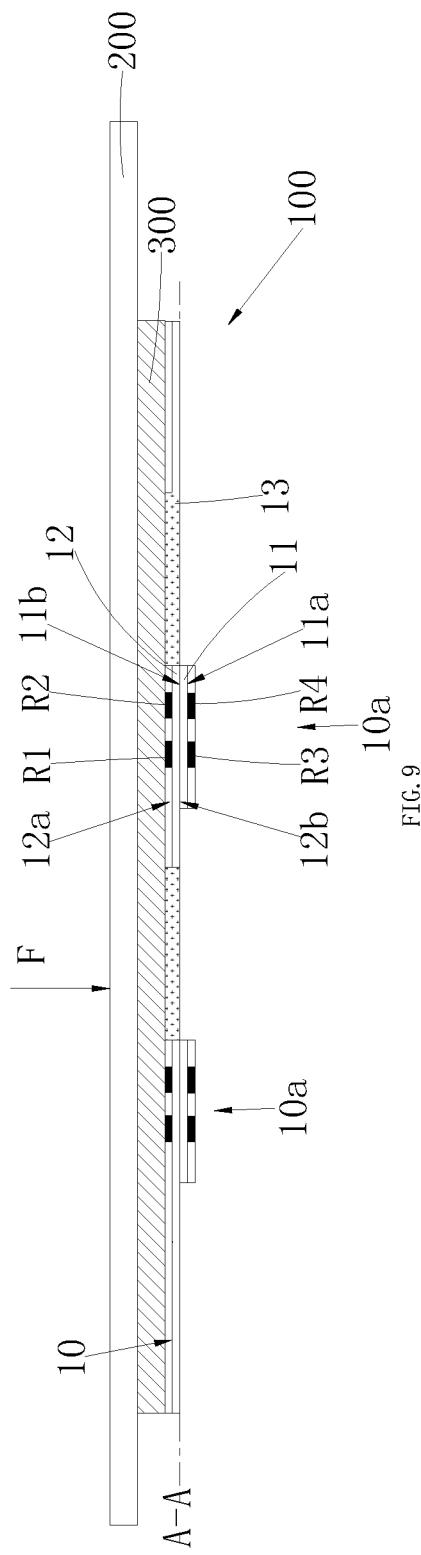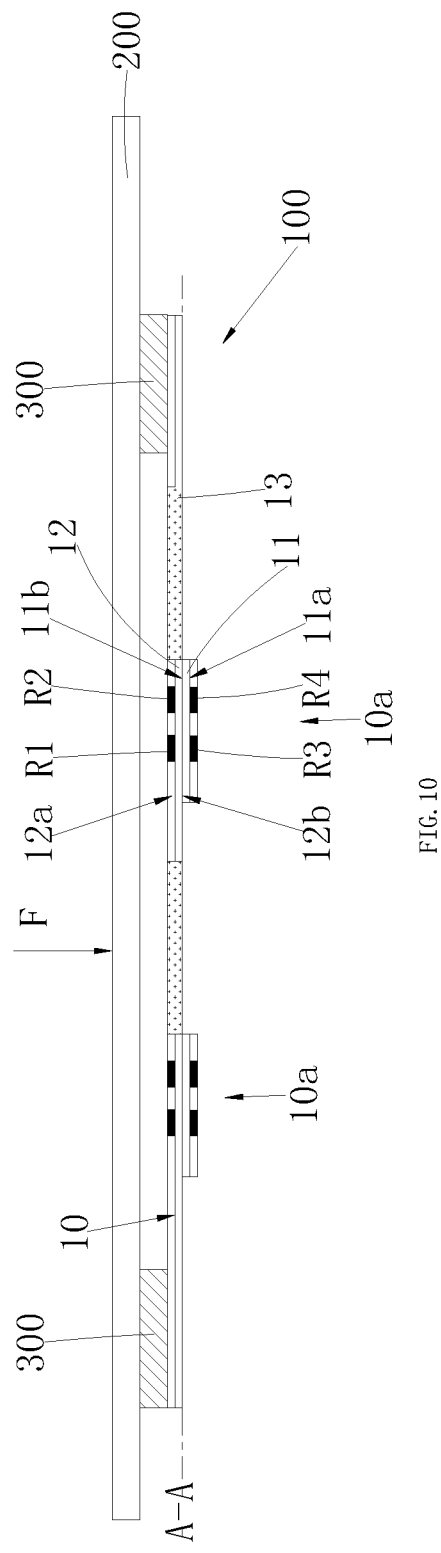

PRESSURE SENSOR, ELECTRONIC DEVICE, AND METHOD FOR MANUFACTURING PRESSURE SENSOR

This application is the U.S. national phase of International Application No. PCT/CN2016/073725 filed 6 Feb. 2016, the entire contents of which is hereby incorporated by reference.

TECHNICAL FIELD

The present application relates to the technical field of pressure sensing, and more particularly to a pressure sensor, electronic device and a method for manufacturing the pressure sensor.

BACKGROUND

In the industry today, there already exist some pressure sensors, such as resistance strain gauge type, capacitive sensing type, and piezoelectric ceramic type. These pressure sensors are formed by complex circuit design and structural design to form the pressure sensor itself. For example, the resistance strain gauge type needs to select strain gauges that meet the requirements of resistance and deviation in a plurality of produced strain gauges, combining the strain gauges into a certain circuit structure, and connecting to the sensing structure by the adhesive. The strain gauge has a low pressure deformation, so the sensing structure needs to be accurately positioned and carefully bonded. While the capacitive sensing type needs to strictly control the distance of each capacitor point from the panel, and obtains pressure information by changing the distance. This approach requires extremely high machining accuracy and assembly accuracy. While the piezoelectric ceramic type obtains pressure information by instantaneous impact on the piezoelectric ceramic to obtain a short-term voltage change; its manufacture requires uniform piezoelectric ceramic parts, and needs to be installed in a set structure by a special mounting method. This practice has greatly increased the cost of using pressure sensors, which has brought difficulties to the large-scale promotion of pressure sensing. In addition, the existing pressure sensors are difficult to have little different resistance value of all the resistors in one pressure measuring circuit, and it is difficult to ensure the uniformity and consistency of the resistance values of all the resistors, the assembly method requires extremely high, pressure detection accuracy low, and high production costs, took up space in the structure. In particular, these pressure sensors are less resistant to external environmental disturbances, and under temperature variation conditions, the pressure sensors are affected, therefore resulting in inaccurate pressure measurement.

SUMMARY

An object of the present application is to provide a pressure sensor in order to solve the problem that the existing pressure sensors are difficult to ensure the uniformity and consistency of the resistance of all resistors, less resistant to external environmental disturbances or the pressure measurement is inaccurate when the temperature changes, and took up space in the structure. The present application is achieved in such a method that a pressure sensor, comprising:

a substrate, the substrate comprises at least one sensing area, the sensing area is provided with a hollow groove, and a foldable portion is formed inside of the hollow groove, the sensing area further comprising: a fixed portion attached the foldable portion along a broken line, the foldable portion having a first mounting surface and a first bonding surface disposed opposite to each other, the fixed portion having a second mounting surface and a second bonding surface disposed opposite to each other, the first mounting surface is on the same side as the second mounting surface and the first bonding surface is on the same side as the second bonding surface; and a pressure measuring circuit, the number of the pressure measuring circuits is equal to the number of the sensing areas, the pressure measuring circuits are disposed correspondingly on the sensing area, each of the pressure measuring circuits having a simultaneous molded at least two resistors on the sensing area, wherein at least one of the resistors is located on the first mounting surface corresponding to the sensing area, and the other resistor is located on the second mounting surface corresponding to the sensing area, and at least one of the resistors is a strain sensing resistor for detecting a deflection deformation of the substrate, and the resistors in each of the pressure measuring circuits are adjacently distributed when the first bonding surface and the second bonding surface are attached.

Another object of the present application is to provide an electronic device, comprising: a panel, a pressure sensor, and a pressure sensing detection circuit electrically connected to the pressure sensor, the substrate is connected to an inner side of the panel.

Another object of the present application is to provide a method of manufacturing a pressure sensor, comprising the steps S1) providing the substrate, providing at least one hollow groove on the substrate, and at the inner side of the hollow groove is provided a foldable portion, and a fixed portion attached to the foldable portion along a broken line;

S2) simultaneously molding at least two resistors by using the same process at the first mounting surface and the second mounting surface to ensure that at least one of the resistors is located on the first mounting surface, and the other resistor is located on the second mounting surface, and at least one of the resistors is a strain sensing resistor for detecting a deflection deformation of the substrate;

S3) folding the foldable portion along the broken line to attach with the fixed portion, and the first bonding surface is in contact with the second bonding surface;

S4) electrically connecting the resistors on each of the sensing areas to form a pressure measuring circuit.

Comparing to the prior art, the technical effect of the present application is that the each sensing area of the substrate is provided with a hollow groove to form a foldable portion, and the foldable portion can be folded along the broken line to the fixed portion, at least two resistors are simultaneously molded at the folding portion and the fixed portion ensuring uniformity and consistency of resistance of all resistors, at least one of resistors is a strain sensing resistor, and the foldable portion is folded to the fixed portion, and the resistors are electrically connected to form a pressure measuring circuit. The pressure sensor is connected to the desired panel to accurately detect the curved deformation of the panel.

When the panel is pressed, the panel will generate a deflection deformation, causing the pressure sensor to generate a corresponding deformation. The strain sensing resistor is deformed, causing a change in electrical characteristics, and then the corresponding electrical signal output is obtained through the pressure sensing detection circuit. The resistors in a pressure measuring circuit are adjacently distributed, and the resistance value of the resistor changes with temperature at the same time, so that the influence of the temperature change on the pressure measuring circuit is very small, and the resistance against the external environment interference is good.

The pressure sensor is easy to manufacture and assemble, the process is simple, can realize pressure recognition and detection, the sensitivity is high, and avoiding the requirement that the existing pressure sensor assembly method is extremely high, the pressure detection precision is low, and the manufacture cost is high. The thickness of the pressure sensor can be from 0.08 mm to 3 mm and is suitable for the mobile phone industry where the thickness is currently high.

BRIEF DESCRIPTION OF THE DRAWINGS

FIG. 1 is a schematic structural view of a pressure sensor according to a first embodiment of the present application;

FIG. 2 is a schematic structural view of the pressure sensor of FIG. 1 when the foldable portion is flush with the fixed portion;

FIG. 9 is a schematic structural view of an electronic device according to a first embodiment of the present application;

FIG. 10 is a schematic structural view of an electronic device according to a second embodiment of the present application.

Figure 3:
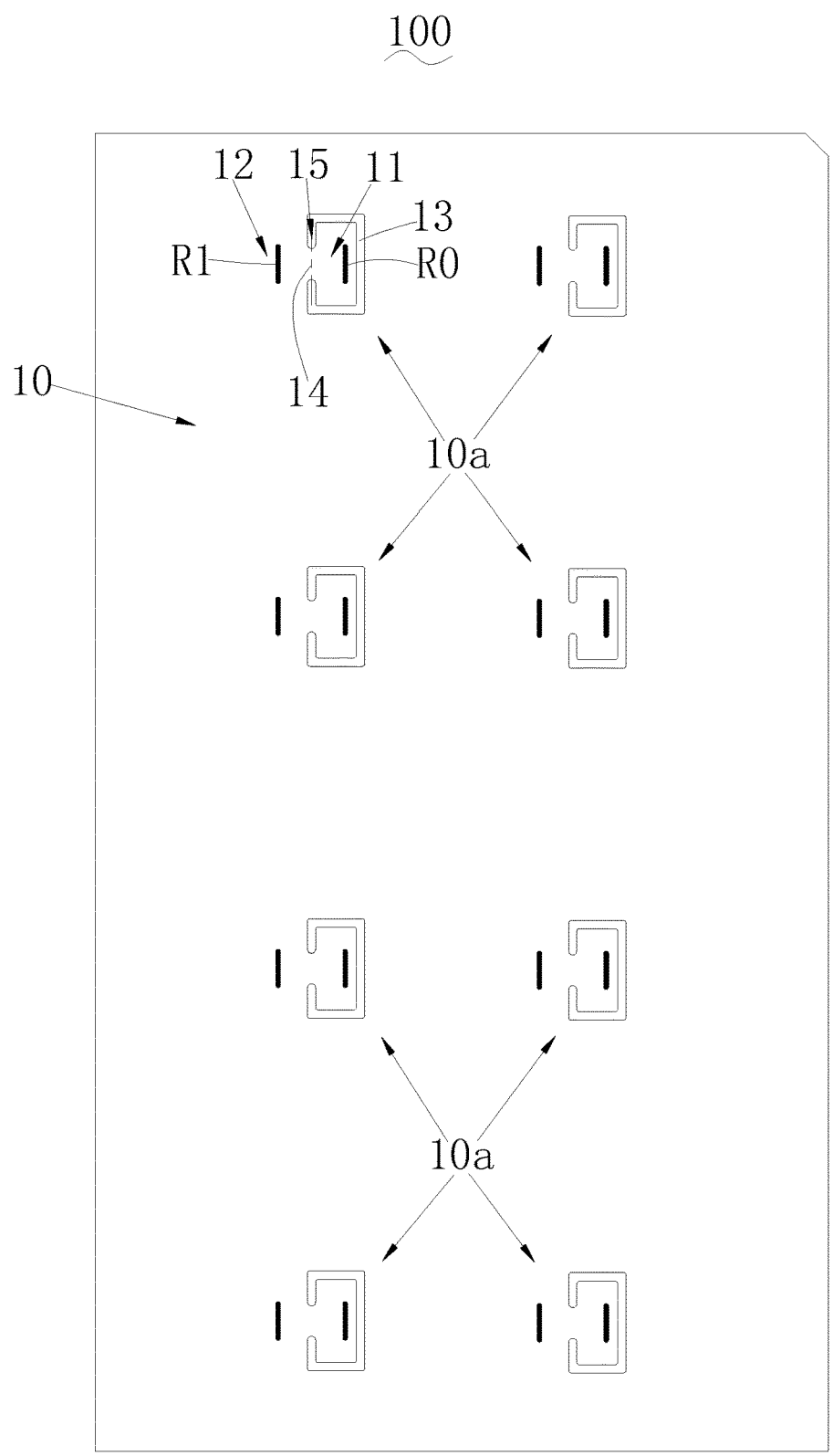
FIG. 3 is a top view of the pressure sensor of FIG. 2.

in the drawings, the following reference numerals are used:

pressure sensor 100, fixed portion 12, first sensor layer 21;
substrate 10, second mounting surface 12a, second sensor layer 22;
sensing area 10a, second bonding surface 12b, panel 200;
foldable portion 11, hollow groove 13, adhesive 300;
first mounting surface 11a, constriction portion 14;
first bonding surface 11b, broken line 15;
strain sensing resistors R1, R2, R3, R4;
reference resistor R0.

DETAILED DESCRIPTION OF THE EMBODIMENTS

In order to make the purpose, technical solutions, and beneficial effects of the present application clearer and more understandable, the present application will be further described in detail herein after with reference to the accompanying drawings and embodiments. It should be understood that the embodiments described herein are only intended to illustrate but not to limit the present application.

Please refer to FIG. 1 to FIG. 3, a pressure sensor 100 according to a first embodiment of the present application, comprising:

A substrate 10, the substrate 10 comprises at least one sensing area 10a, the sensing area 10a is provided with a hollow groove 13, and the a foldable portion 11 is formed inside of the hollow groove 13, the sensing area 10a further comprising: a fixed portion 12 attached the foldable portion 11 along a broken line 15, the foldable portion 11 having a first mounting surface 11a and a first bonding surface 11b disposed opposite to each other, the fixed portion 12 having a second mounting surface 12a and a second bonding surface 12b disposed opposite to each other, the first mounting surface 11a is on the same side as the second mounting surface 12a and the first bonding surface 11b is on the same side as the second bonding surface 12b; and a pressure measuring circuit, the number of the pressure measuring circuits is equal to the number of the sensing areas 10a, the pressure measuring circuits are disposed correspondingly on the sensing area 10a, each of the pressure measuring circuits having a simultaneous molding at least two resistors on the sensing area 10a, wherein at least one of the resistors is located on the first mounting surface 11a corresponding to the sensing area 10a, and the other resistor is located on the second mounting surface 12a corresponding to the sensing area 10a, and at least one of the resistors is a strain sensing resistor for detecting a deflection deformation of the substrate, and the resistors in each of the pressure measuring circuits are adjacently distributed when the first bonding surface 11b and the second bonding surface 12b are attached.

The each sensing area 10a of the substrate 10 is provided with a hollow groove 13 to form a foldable portion 11, and the foldable portion 11 can be folded along the broken line 15 to the fixed portion 12, at least two resistors are simultaneously molded at the folding portion and the fixed portion ensuring uniformity and consistency of resistance of all resistors, at least one of resistors is a strain sensing resistor, and the foldable portion 11 is folded to the fixed portion 12, and the resistors are electrically connected to form a pressure measuring circuit. The pressure sensor 100 is connected to the desired panel 200 to accurately detect the curved deformation of the panel 200.

When the panel 200 is pressed, the panel 200 will generate a deflection deformation, causing the pressure sensor 100 to generate a corresponding deformation. The strain sensing resistor R1 is deformed, causing a change in electrical characteristics, and then the corresponding electrical signal output is obtained through the pressure sensing detection circuit. The resistors in a pressure measuring circuit are adjacently distributed, and the resistance value of the resistor changes with temperature at the same time, so that the influence of the temperature change on the pressure measuring circuit is very small, and the resistance against the external environment interference is good.

The pressure sensor 100 is easy to manufacture and assemble, the process is simple, the structure is compact, can realize pressure recognition and detection, the sensitivity is high, and avoiding the requirement that the existing pressure sensor assembly method is extremely high, the pressure detection precision is low, and the manufacture cost is high. The thickness of the pressure sensor can be from 0.08 mm to 3 mm and is suitable for the mobile phone industry where the thickness is currently high.

The strain sensing resistor R1 can be a deformation sensitive resistor, a varistor, a strain gauge, an Force Sensing Resistor (FSR) resistive pressure sensor, or other strain sensing resistor.

Further, a constriction portion 14 is connected between the fixed portion 12 and the foldable portion 11, and the constriction portion 14 is located at the broken line 15. The width of the constriction portion 14 is smaller than the width of the fixed portion 12, and the width of the constriction portion 14 is smaller than the width of the foldable portion 11, which convenient for folding the folding portion 11 to the fixed portion 12 along the broken line 15.

Further, a first sensor layer 21 is disposed on the first mounting surface 11a of the folding portion 11, a resistor or a circuit is disposed in the first sensor layer 21; a second sensor is disposed on the second mounting surface 12a of the fixed portion 12, a resistor layer or circuit is provided in the second sensor layer 22. This scheme is easy to be processed.

Further, a circuit disposed between the resistors on both sides of the fixed portion 12 and the foldable portion 11 to realize electrical connection, and the scheme is easy to be processed for the circuit located at the position of folding.

Further, the number of pressure measuring circuits is at least two, and the pressure measuring circuits are distributed in an array on the substrate 10. In this scheme, when the pressure is applied to the plurality of positions of the panel 200, the strain sensing resistor R1 follows the deflection deformation of the panel 200 to generate a measurement signal, and the amount of deflection deformation of the panel 200 is measured. The number of bridge circuits can vary depending on the physical size of the panel 200. The position of multiple pressure measurement circuits can be set as needed.

Figure 4:
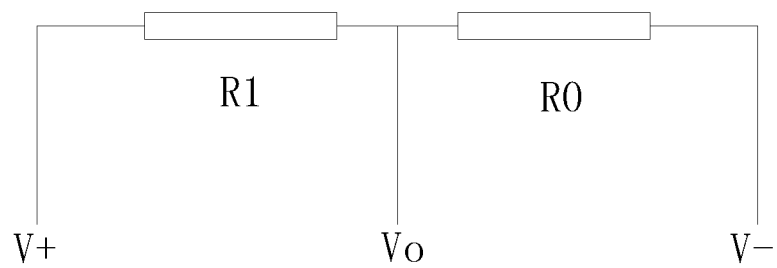
FIG. 4 is a schematic view of a pressure measuring circuit applied to the pressure sensor of FIG. 1.

Further, please refer to FIG. 4 at the same time, a pressure measuring circuit has two resistors, and the pressure measuring circuit is a series circuit formed by a strain sensing resistor R1 and a reference resistor R0 in series.

Using a constant voltage source, inflicting input voltage Ui on both ends of V+ and V−, detect the potential at Vo, or measure the output voltage Uo between Vo and ground, there are input and output voltage formulas:

$$U_o = \frac{R_1}{R_1 + R_0} U_i$$

When the strain sensing resistor R1 is deformed, and its electrical characteristics are changed, and the pressure measuring circuit obtains the output voltage Uo. Through the pressure sensing detection circuit, the corresponding electrical signal output is obtained, and pressure recognition and detection are realized.

It can be understood that a pressure measuring circuit has two resistors, and the pressure measuring circuit is a series circuit formed by connecting two strain sensing resistors in series. The scheme can also obtain the corresponding electrical signal output through the pressure sensing detection circuit to realize pressure identification and detection.

Further, the substrate 10 comprises a base board and a circuit layer disposed on the base board. The circuit layer can implement predetermined circuit functions.

Further, the base board is one of a group consisting of a PI film (polyimide film), a PET film (high temperature resistant polyester film) and a glass fiber board. The base board can be equipped with a strain sensing resistor. It will be appreciated that the base board may also be other base boards. Further, the circuit layer is disposed on one side or both sides of the base board. All of the above schemes enable the pressure sensor 100 to perform predetermined circuit functions.

Further, the resistor is a print molded resistor, a coated molded resistor, a print molded polymer coating having a pressure-sensitive property, or a sintered molded piezoelectric ceramic coating. All of the above resistors can change the resistance according to the deformation or as a reference resistor. The pressure sensor 100 can be made by printing or coating, and its thickness can be very thin: 0.08 mm-3 mm, which is suitable for the mobile phone industry which currently has a high thickness requirement.

Further, the substrate 10 is a flexible circuit board or a rigid circuit board. The flexible circuit board or the rigid circuit board has a circuit distribution that implements predetermined circuit functions. When the substrate 10 is a flexible circuit board, the substrate 10 is connected to the entire surface of the panel 200; when the substrate 10 is a rigid circuit board, the substrate 10 is connected to the entire surface or the periphery of the panel 200. It can be understood that the substrate 10 can also be other substrates 10 with their own circuits.

Figure 5:
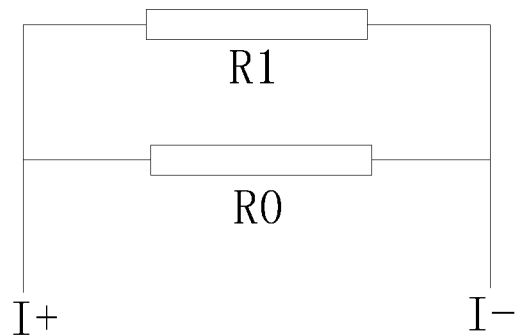
FIG. 5 is a schematic view of a pressure measuring circuit applied in a pressure sensor according to a second embodiment of the present application.
Figure 6:
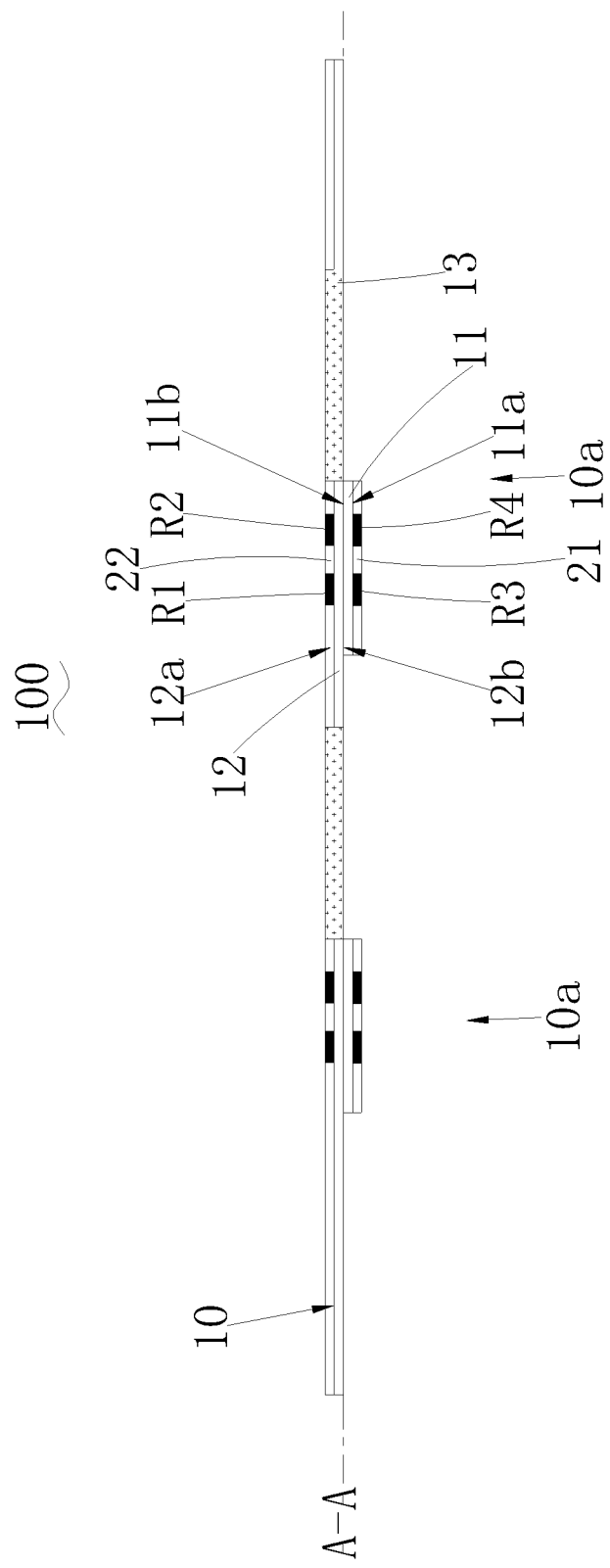
FIG. 6 is a schematic structural view of a pressure sensor according to a third embodiment of the present application.
Figure 7:
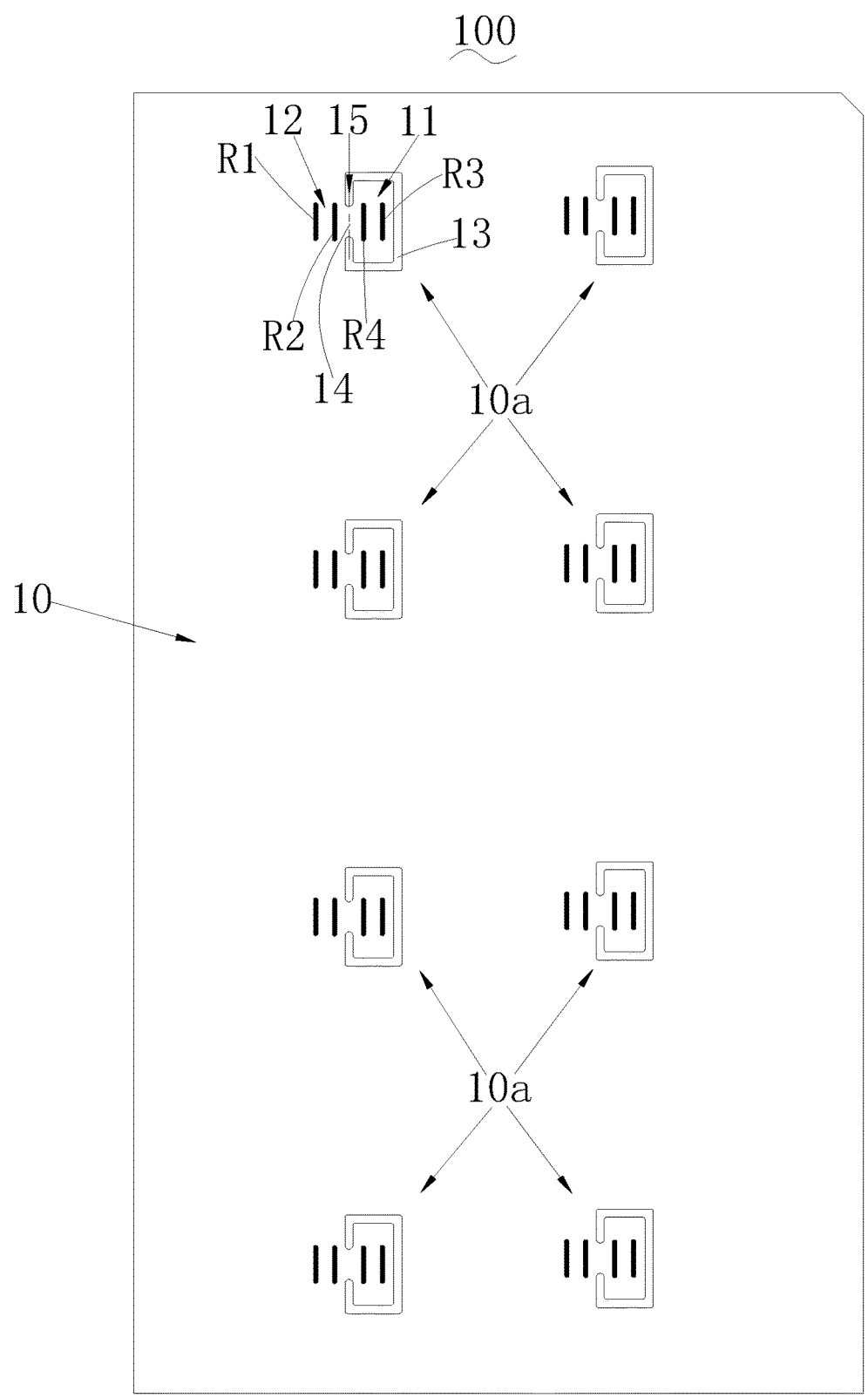
FIG. 7 is a top view of the pressure sensor of FIG. 6.
Figure 8:
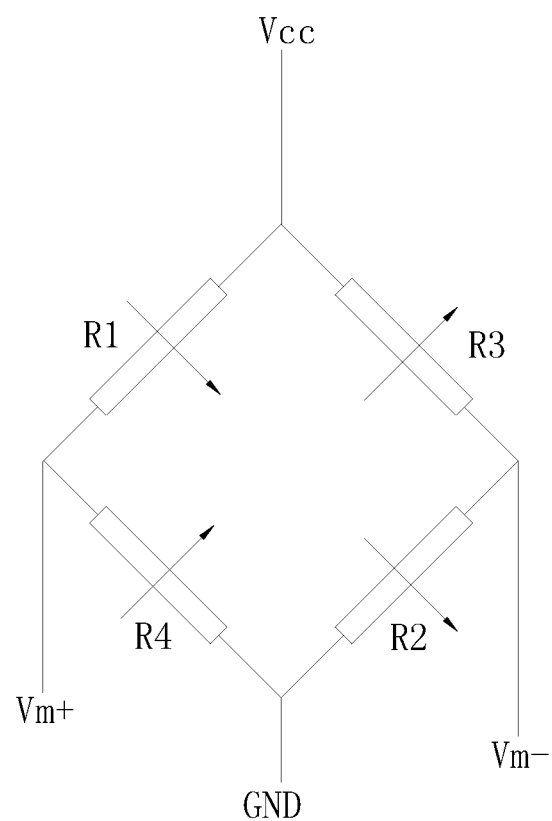
FIG. 8 is a schematic view of a pressure measuring circuit applied to the pressure sensor of FIG. 6.

Please refer to FIG. 5, the pressure sensor 100 provided by the second embodiment of the present application is substantially the same as the pressure sensor 100 provided by the first embodiment, unlike the first embodiment, a pressure measuring circuit has two resistors, and the measuring circuit is a parallel circuit formed by a strain sensing resistor R1 in parallel with a reference resistor R0.

Using a constant current source, inflicting input current I on both ends of I+ and I−, measuring the output current I1 on the R1 branch, $$I_1 = \frac{R_0}{R_1 + R_0} I$$

and there are input and output current formulas:

When the strain sensing resistor R1 is deformed, its electrical characteristics will correspondingly change, and consequently the pressure measuring circuit obtains the output current I1. Through the pressure sensing detection circuit, the corresponding electrical signal output is obtained, and pressure recognition and detection are realized.

It can be understood that a pressure measuring circuit has two resistors, and the pressure measuring circuit is a parallel circuit formed by two strain sensing resistors connected in parallel. The scheme can also obtain the corresponding electrical signal output through the pressure sensing detection circuit to realize pressure identification and detection.

Please refer to FIG. 6 to FIG. 9, the pressure sensor 100 provided by the third embodiment of the present application is substantially the same as the pressure sensor 100 provided by the first embodiment, unlike the first embodiment, a pressure measuring circuit has four resistors. The pressure measuring circuit is a full bridge formed by electrically connecting four strain sensing resistors R1, R2, R3, and R4. The two strain sensing resistors R1 and R2 are disposed on the first mounting surface 11a, and the two strain sensing resistors R3 and R4 are disposed on the second mounting surface 12a.

The two strain sensing resistors R1 and R2 and two strain sensing resistors R3 and R4 disposed on two sides of the substrate 10 respectively form a bridge circuit, and the pressure sensor 100 is connected to the required panel 200, and curved variable of the panel 200 can be detected. When the panel 200 is pressed, the panel 200 will generate a deflection deformation, which causing the pressure sensor 100 to generate a corresponding deformation. The substrate 10 after the foldable portion 11 is folded along the broken line 15 to the fixing portion 12 has a certain thickness, at the center line A-A of the substrate 10, the size length of the substrate 10 does not change after the substrate 10 is bent and deformed, on a surface of the substrate 10 which coincides with the deflection direction, the substrate 10 becomes large in size length, while the surface of the substrate 10 facing away from the deflection direction becomes smaller in size length. The resistors on both sides of the substrate 10 are deformed differently, which causing changes or changes in different level of electrical characteristics, and then the corresponding electrical signal output is obtained through the pressure sensing detection circuit.

Specifically, the strain sensing resistors R1 and R2 and the strain sensing resistors R3 and R4 are molded on a printed circuit layer of the substrate 10, and the circuit layer is used to connect the strain sensing resistors.

In the bridge circuit composed of strain sensing resistors R1 and R2 and strain sensing resistors R3 and R4, inputting a voltage Ui, and an output voltage Uo is obtained at both ends of Vm+ and Vm−, and there are an input and output voltage formulas:

$$U_o = \frac{R_1 R_2 - R_3 R_4}{(R_1 + R_4)(R_2 + R_3)} U_i$$

Since the resistance of the strain sensing resistor changes according to the deformation, it is necessary to obtain two sets different deformations of resistance values, and the strain sensing resistors R1 and R2 and the strain sensing resistors R3 and R4 must be deformed differently. The pressure sensor 100 is placed behind the panel 200 (such as a mobile phone screen), when the panel 200 is pressed, the strain sensing resistor will be deformed according to the deformation of the panel 200, and where the spatial position of the panel 200 is similar, the shape variable is also similar, so the strain sensing resistors R1 and R2 and the strain sensing resistors R3 and R4 need to be differently deformed and must be placed far apart.

Strain sensing resistors are sensitive to temperature, and changes in temperature will cause changes in resistance. In electronic devices (such as mobile phones), there are different devices in different areas under the screen, and some places have batteries, chips, etc. These devices will be heated during use, causing large temperature differences in different areas; at the same time, the heating of the screen is uneven, it will also cause a large difference in temperature between different areas. In this way, the two sets of strain sensing resistors distributed farther away will have different resistance values due to the difference in temperature. Such a phenomenon will interfere with the pressure deformation and cause the resistance value to change, and become a serious disturbance factor affecting pressure sensing.

The strain sensing resistors R1 and R2 are disposed on the first mounting surface 11a, and the strain sensing resistors R3 and R4 are disposed on the second mounting surface 12a, the relative positions of the strains on the two sides relative to the bridge may coincide, or may be placed in a similar with a certain misalignment position. Connecting the pressure sensor 100 to the desired panel 200 can detect the curved deformation of the panel 200. When the panel 200 is pressed, the panel 200 will generate a deflection deformation, which causing the pressure sensor 100 to generate a corresponding deformation. The R1, R2 and R3, R4 located on both sides of the substrate 10 will generate different deformations, which resulting in different changes in resistance, so that a voltage change will be generated through the bridge circuit, thereby obtaining an output voltage Uo as an output signal.

At the same time, in this way, the two sets strain sensing resistors of the bridge can be in close proximity, at close positions, the temperature changes are similar, the two sets of strain sensing resistors will simultaneously heat up or simultaneously cool down, and the resistance value will increase at the same time, or it will decrease at the same time without affecting the change of voltage difference. Therefore, such a design not only ensures that the two sets of strain sensing resistors in the bridge have different deformation variables, but also ensures that the temperature change has little influence on the deformation variables, thereby solving the problem of temperature interference.

It can be understood that a pressure measuring circuit has four resistors, and the pressure measuring circuit is a Wheatstone bridge formed by electrically connecting a strain sensing resistor R1 and three reference resistors R0; or a pressure measuring circuit has four resistors, the pressure measuring circuit is a half bridge formed by electrically connecting two strain sensing resistors and two reference resistors R0. Preferably, when the pressure measuring circuit is a half bridge, one of the strain sensing resistors is located on the first mounting surface 11a, and the other strain sensing resistor is located on the second mounting surface 12a. Alternatively, a pressure measuring circuit has four resistors, and the pressure measuring circuit is a bridge circuit formed by electrically connecting three strain sensing resistors to one reference resistor R0. The above schemes are capable of generating a measurement signal following the deflection deformation of the panel 200 when pressure is applied to the panel 200, and measuring the amount of deflection deformation of the panel 200.

Further, in a pressure measuring circuit, the two resistors coincide with the other two resistors in the thickness direction of the substrate 10; or, in a pressure measuring circuit, four resistors are staggered distributed. The above scheme can connect the pressure sensor 100 to the curved deformation variable of the detection panel 200 on the desired panel 200.

Please refer to FIG. 9, an electronic device according to a first embodiment of the present application comprises a panel 200, a pressure sensor 100, and a pressure sensing detection circuit electrically connected to the pressure sensor 100, the substrate 10 is connected to the inner side of the panel 200.

The pressure sensor 100 is in the form of a film or a plate, and the pressure sensor 100 is laminated with the panel 200, which is compact and easy to install.

Specifically, the pressure sensing detection circuit analyzes the electrical signal of the pressure sensor 100 and together with the touch position information detected by the panel 200 are transmitting to the main controller of the electronic device. Thereby achieving an accurate pressure to obtain a touch while recognizing the touch position, which is prior art.

The panel 200 can be a touch screen, display, or other electronic device having a rigid structure. By connecting the pressure sensor 100 to the panel 200, it is possible to accurately recognize the touch pressure while accurately recognizing the touch position, thereby expanding the application space for the electronic device in product application, human-computer interaction and consumption experience. Users can directly obtain accurate pressure levels and quantities by touching the touch screen, display or electronic device. After the correction, the exact pressure value of the press can be obtained.

Specifically, the panel 200 may be a glass plate having a thickness of 1.1 mm, and the glass plate itself is designed with a function of a touch screen; or, the panel 200 may be a LCD liquid crystal display or an OLED display having a thickness of 1.6 mm; or the panel 200 may be an electronic components having a touch function and display function.

The pressure sensing detection circuit is used for detecting an electrical signal obtained by the pressure sensor 100, and processing and analyzing the electrical signal. The pressure sensor 100 is connected to the pressure sensing detecting circuit through a connecting line. The connecting line is merely a description of the combination of the pressure sensor 100 and the pressure sensing detecting circuit. As other embodiments, the pressure sensor 100 can be directly or indirectly electrically connected with the pressure sensing detecting circuit by other methods.

Further, the substrate 10 and the panel 200 are bonded by an adhesive 300. This configuration is easy to assemble, and the substrate 10 is firmly connected to the panel 200 and can also transmit deformation. The adhesive 300 may be double-sided glue, VHB acrylic Styrofoam, AB glue, epoxy resin or the like. The material selection and thickness of these glue materials are determined according to the materials of the substrate 10 and the panel 200.

Further, the substrate 10 and the panel 200 are fully connected to each other. The scheme can cause the panel 200 to generate a deflection deformation when the panel 200 is pressed, so that the pressure sensor 100 also generates a corresponding deformation, and the pressure sensor 100 converts the deformation into an electrical signal, and outputs the pressure value at this time.

Please refer to FIG. 10, the electronic device according to a second embodiment of the present application is substantially the same as the electronic device provided in the first embodiment, unlike the first embodiment, the substrate 10 is connected to the periphery of the panel 200. The scheme can cause the panel 200 to generate a deflection deformation when the panel 200 is pressed, so that the pressure sensor 100 also generates a corresponding deformation, and the pressure sensor 100 converts the deformation into an electrical signal, and outputs the pressure value at this time. Specifically, at least two constraint bits are disposed between the substrate 10 and the panel 200. The substrate 10 and the panel 200 are bonded by an adhesive 300.

Please refer to FIGS. 1 to 3, a method for manufacturing a pressure sensor 100 according to an embodiment of the present application, comprising the steps The method for manufacturing the pressure sensor 100 comprises the following steps:

S1) providing the substrate 10, providing at least one hollow groove 13 on the substrate 10, and at the inner side of the hollow groove 13 is provided a foldable portion 11, and a fixing portion 12 folding attaches with the foldable portion 11 along a broken line 15;

S2) simultaneously molding at least two resistors by using the same process at the first mounting surface 11a and the second mounting surface 12a to ensure that at least one of the resistors is located on the first mounting surface 11a, and the other resistor is located on the second mounting surface 12a, and at least one of the resistors is a strain sensing resistor R1 for detecting a deflection deformation of the substrate 10;

S3) folding the foldable portion 11 along the broken line 15 to attach with the fixing portion 12, and the first bonding surface 11b is in contact with the second bonding surface 12b;

S4) electrically connecting the resistors on each of the sensing areas 10a to form a pressure measuring circuit.

The each sensing area 10a of the substrate 10 is provided with a hollow groove 13 to form a foldable portion 11, and the foldable portion 11 can be folded along the broken line 15 to the fixing portion 12, at least two resistors are simultaneously molded at the folding portion and the fixed portion ensuring uniformity and consistency of resistance of all resistors, at least one of resistors is a strain sensing resistor, and the foldable portion 11 is folded to the fixed portion 12, and the resistors are electrically connected to form a pressure measuring circuit. The pressure sensor 100 is connected to the desired panel 200 to accurately detect the curved deformation of the panel 200.

When the panel 200 is pressed, the panel 200 will generate a deflection deformation, causing the pressure sensor 100 to generate a corresponding deformation. The strain sensing resistor R1 is deformed, causing a change in electrical characteristics, and then the corresponding electrical signal output is obtained through the pressure sensing detection circuit. The resistors in a pressure measuring circuit are adjacently distributed, and the resistance value of the resistor changes with temperature at the same time, so that the influence of the temperature change on the pressure measuring circuit is very small, and the interference against the external environment is good.

The pressure sensor 100 is easy to manufacture and assemble, the process is simple, can realize pressure recognition and detection, the sensitivity is high, and avoiding the requirement that the existing pressure sensor assembly method is extremely high, the pressure detection precision is low, and the manufacture cost is high. The thickness of the pressure sensor can be from 0.08 mm to 3 mm and is suitable for the mobile phone industry where the thickness is currently high.

Further, using print molded resistor simultaneously;

alternatively, using coating molded resistor simultaneously;

alternatively, using printed molded polymer coating having a pressure-sensitive property to form a resistor;

alternatively, using sintered molded piezoelectric ceramic coating to form a resistor.

All of the above resistors can change the resistance according to the deformation or as a reference resistor.

Further, a strain sensing resistor R1 is connected in series with a reference resistor R0 to form a series circuit as a pressure measuring circuit;

alternatively, two strain sensing resistors are connected in series to form a series circuit as a pressure measuring circuit;

alternatively, a strain sensing resistor R1 is connected in parallel with a reference resistor R0 to form a parallel circuit as a pressure measuring circuit;

alternatively, two strain sensing resistors are connected in parallel to form a parallel circuit as a pressure measuring circuit;

alternatively, a strain sensing resistor R1 is electrically connected to three reference resistors R0 to form a Wheatstone bridge as a pressure measuring circuit;

alternatively, two strain sensing resistors are electrically connected to two reference resistors R0 to form a half bridge as a pressure measuring circuit;

alternatively, the four strain sensing resistors R1, R2, R3, and R4 are electrically connected to form a full bridge as a pressure measuring circuit;

alternatively, three strain sensing resistors are electrically connected to a reference resistor to form a bridge circuit as a pressure measuring circuit.

The aforementioned embodiments are only preferred embodiments of the present application, and are not intended to limit the present application. Any modification, equivalent replacement, improvement, and so on, which are made within the spirit and the principle of the present application, should be included in the scope of the present application. Therefore, the scope of the present application is subject to the scope of the claims.

What is claimed is:

1. A pressure sensor, comprising:
a substrate, the substrate comprises at least one sensing area, wherein the sensing area is provided with a hollow groove, and a foldable portion is formed inside of the hollow groove, and the sensing area further comprises: a fixed portion attached to the foldable portion along a broken line, the foldable portion having a first mounting surface and a first bonding surface disposed opposite to each other, the fixed portion having a second mounting surface and a second bonding surface disposed opposite to each other, the first mounting surface being on the same side as the second mounting surface, and the first bonding surface being on the same side as the second bonding surface; and
at least one pressure measuring circuit, the number of the at least one pressure measuring circuit is equal to the number of the at least one sensing area, each of the at least one pressure measuring circuit is disposed correspondingly on one of the at least one sensing area, each of the at least one pressure measuring circuit having at least two resistors simultaneously molded on the corresponding sensing area, wherein at least one of the resistors is located on the first mounting surface corresponding to the sensing area, and the other resistor is located on the second mounting surface corresponding to the sensing area, and at least one of the resistors is a strain sensing resistor for detecting a deflection deformation of the substrate, and the resistors in each of the at least one pressure measuring circuit are adjacently distributed when the first bonding surface and the second bonding surface are attached.

2. The pressure sensor of claim 1, wherein a constriction portion is connected between the fixed portion and the foldable portion, and the constriction portion is located at the broken line.

3. The pressure sensor of claim 1, wherein the at least one pressure measuring circuit comprises at least two pressure measuring circuits distributed in an array on the substrate.

4. The pressure sensor of claim 1, wherein one of the at least one pressure measuring circuit has two resistors, and the pressure measuring circuit is a series circuit formed by a strain sensing resistor R1 and a reference resistor R0 connected in series,
a series circuit formed by two strain sensing resistors connected in series,
a parallel circuit formed by a strain sensing resistor and a reference resistor connected in parallel, or
a parallel circuit formed by two strain sensing resistors connected in parallel.

5. The pressure sensor of claim 1, wherein one of the at least one pressure measuring circuit comprises four resistors, and the pressure measuring circuit comprises a Wheatstone bridge formed by electrically connecting a strain sensing resistor and three reference resistors,
a half bridge formed by electrically connecting two strain sensing resistors and two reference resistors,
a full bridge formed by electrically connecting four strain sensing resistors; or
a bridge circuit formed by electrically connecting three strain sensing resistors and one reference resistor.

6. The pressure sensor of claim 5, wherein in the pressure measuring circuit, the two resistors coincide with the other two resistors in a thickness direction of the substrate, or
four resistors are staggered distributed.

7. The pressure sensor of claim 1, wherein the substrate comprises a base board and a circuit layer disposed on the base board.

8. The pressure sensor of claim 7, wherein the base board comprises a PI film, a PET film or a glass fiber board.

9. The pressure sensor of claim 1, wherein the resistor is a print molded resistor, a coated molded resistor, a print molded polymer coating having a pressure-sensitive property, or a sintered molded piezoelectric ceramic coating.

10. An electronic device, comprising the pressure sensor of according to claim 1 and a pressure sensing detection circuit electrically connected to said pressure sensor, wherein the substrate is connected to the inner side of the panel.

11. The electrical device of claim 10, wherein the substrate and the panel are bonded by an adhesive.

12. The electronic device of claim 10, wherein the substrate and the panel are connected to each other on the whole face, or the substrate is connected to the panel on the periphery.

13. A method for manufacturing the pressure sensor of claim 1, comprising the following steps:
S1) providing the substrate, providing at least one hollow groove on the substrate, and at the inner side of the hollow groove is provided with the foldable portion, and the fixing portion folding attaches with the foldable portion along a broken line;
S2) simultaneously molding at least two resistors by using the same process at the first mounting surface and the second mounting surface to ensure that at least one of the resistors is located on the first mounting surface, and the other resistor is located on the second mounting surface, and at least one of the resistors is a strain sensing resistor for detecting a deflection deformation of the substrate;
S3) folding the foldable portion along the broken line to attach with the fixing portion, and the first bonding surface is in contact with the second bonding surface; and
S4) electrically connecting the resistors on each of the sensing areas to form a pressure measuring circuit.

14. The method of claim 13, wherein at least one of the at least two resistors is formed by using a print molded resistor simultaneously,
using a coating molded resistor simultaneously,
using a printed molded polymer coating having a pressure-sensitive property, or
using a sintered molded piezoelectric ceramic coating.

15. The method of claim 13, wherein one of the at least one pressure measuring circuit is formed by electrically connecting a strain sensing resistor in series with a reference resistor to form a series circuit,
electrically connecting two strain sensing resistors in series to form a series circuit,
electrically connecting a strain sensing resistor in parallel with a reference resistor to form a parallel circuit,
electrically connecting two strain sensing resistors in parallel to form a parallel circuit,
electrically connecting a strain sensing resistor to three reference resistors to form a Wheatstone bridge
electrically connecting two strain sensing resistors to two reference resistors to form a half bridge electrically connecting the four strain sensing resistors to form a full bridge
or electrically connecting three strain sensing resistors to a reference resistor to form a bridge circuit.

* * * * *